US006536913B1

(12) United States Patent
Yajima et al.

(10) Patent No.: US 6,536,913 B1
(45) Date of Patent: Mar. 25, 2003

(54) FLAT DISPLAY APPARATUS

(75) Inventors: Akihito Yajima, Tokyo (JP); Masahiro Murata, Tokyo (JP); Hitoshi Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/577,095

(22) Filed: May 24, 2000

(30) Foreign Application Priority Data

May 24, 1999 (JP) ........................................ 11-144025
Apr. 11, 2000 (JP) .................................... 2000-109651

(51) Int. Cl.$^{7}$ ............................................. H01L 33/00
(52) U.S. Cl. ...................... 362/231; 362/812; 362/800; 362/249
(58) Field of Search ............................... 362/800, 812, 362/249, 252, 231, 247

(56) References Cited

U.S. PATENT DOCUMENTS 4,345,308 A * 8/1982 Mouyard et al. ........... 362/330
4,628,422 A * 12/1986 Ewald ........................ 362/240
5,005,029 A * 4/1991 Fuse ...................... 346/107 R
5,164,715 A * 11/1992 Kashiwabara et al. ...... 362/228
5,226,723 A * 7/1993 Chen .......................... 362/241
5,660,461 A * 8/1997 Ignatius et al. ............. 362/241
5,990,802 A * 11/1999 Maskeny ............... 340/815.45
6,072,171 A * 6/2000 Nakamura et al. .......... 362/555
6,082,885 A * 7/2000 Belfer ........................ 362/297
6,191,476 B1 * 2/2001 Takahashi et al. .......... 257/706

* cited by examiner

*Primary Examiner*—Thomas M. Sember
(74) *Attorney, Agent, or Firm*—Jay H. Maioli

(57) ABSTRACT

An LED display apparatus capable of reliably preventing damage caused by static electricity without worsening the visual recognition, in which an the display surface of the LED display apparatus is mounted an electrically conductive plate having a thickness nearly equal to, or smaller than, the height of the light-emitting portions L in a direction Z perpendicular to the display surface and having holes 3*a* perforated at positions corresponding to the positions of the light-emitting portions L on the display surface. The electrically conductive plate 3 is grounded, and a current due to the electrostatic discharge flows from the electrically conductive plate 3 into ground.

12 Claims, 6 Drawing Sheets

FLAT DISPLAY APPARATUS

BACKGROUND OF THE INVENTION

1. Field of the Invention

The present invention relates to an LED display apparatus. More particularly, the present invention relates to an LED display apparatus that is adapted to be installed on a place where it can be directly touched by a hand of a user.

2. Description of the Related Art

There have been widely used display apparatus in which a plurality of light-emitting portions using LEDs (light-emitting diodes) as display devices are arranged in the form of segments or a matrix to constitute a display element, as well as display apparatus in which a plurality of display modules each being formed by matrices of light-emitting portions are arranged like tiles.

Most of these conventional display apparatus (referred to as "LED display devices" in this specification) have large pixel pitches (pitches among the individual light-emitting portions) and, hence, offer low resolution.

Therefore, the LED display devices that display images upon receiving video signals must be watched from a visual regognition distance and are, hence, generally installed outdoors, such as on a wall of a building where they cannot be directly touched by human hand.

Recently, however, there has been proposed an LED display device having a small pixel pitch so that it can be watched from a short visual recognition distance, suggesting increasing chances for installing the LED display devices for displaying images on a place where they can be directly touched by human hand in the future.

When the LED display device is installed on a place where it can be directly touched by human hand as described above, there arises a probability that, when the human hand approaches the display surface, an electrostatic discharge may take place between the electrically charged human body and the LED display device that is grounded, and an electric current may flow into the light-emitting portions and the driving ICs due to the electrostatic discharge, resulting in a malfunctioning or breakage of the light-emitting portions and the driving ICs. Therefore, the LED display device installed on such a place requires a countermeasure against damage caused by static electricity.

As one of the countermeasures, it has been attempted as shown, for example, in FIG. 5, to attach louvers 11 which are protrusions extending in a Z-direction in FIG. 5 among the rows of light-emitting portions L arranged like a matrix on the display surface of the LED display device.

By arranging the louvers 11, positions close to the light-emitting portions L inside of the louvers 11 are not accessible by human hand; i.e., a predetermined distance equal to a difference between the height of the louvers 11 and the height of the light-emitting portions L is maintained between the human hand and the light-emitting portions L.

Due to this distance, it is difficult that the current of electric discharge flows into the light-emitting portions or into the driving ICs despite of the occurrence of an electrostatic discharge, lowering the probability of malfunction or breakage in the light-emitting portions and the driving ICs.

According to another countermeasure as shown in, for example, FIG. 6, the whole display surface of the LED display device is covered with a transparent protection film 12. By covering the display surface with the protection film 12, a predetermined distance is also maintained between the human hand and the light-emitting portions L. Even when an electrostatic discharge occurs, therefore, the current of electric discharge does not flow to the light-emitting portions and the driving ICs.

There has been proposed a further LED display device in which the light-emitting portions are mounted on a base plate, such as circuit board, with their lead portions (connection terminals) being exposed. FIG. 7 illustrates an example of the light-emitting portions of this structure, wherein LED lamps 31 of the shape of a bullet are mounted on the LED base plate 32 with the lead portions 31*a* being exposed. In the LED display device having such LED lamps 31, a current due to the electrostatic discharge flows from the lead portions 31*a* into the LED chips in the LED lamps 31 and into the driving ICs on the LED base plate 32, causing a malfunction or a breakage in the LED lamps 31 and in the driving ICs.

In this LED display device, therefore, it has heretofore been attempted, as shown in FIG. 7, to drip a thermosetting silicone resin (or an urethane resin, etc.) 34 from the upper side of the LED base plate 32 contained in a cell case 33 to prevent the leakage of the resin, thereby to seal the lead portions 31*a* with the silicone resin 34, as a countermeasure for preventing damage due to static electricity.

By sealing the lead portions 31*a* with the silicone resin 34 as described above, the current caused by the electrostatic discharge does not flow into the lead portions 31*a*, lowering the probability of malfunction or breakage in the LED lamps 31 and in the driving ICs.

When the protuberances such as louvers protruding forward beyond the light-emitting portions are attached on the display surface as shown in FIG. 5, however, the light-emitting portions are shielded by the protrusions and cannot be seen when the display surface is watched from an upper inclined direction or from a lower inclined direction. Thus, the protuberances such as louvers narrow the visible angle and worsen the visual recognition particularly when the LED device is installed at a close distance so that it can be directly touched by human hand.

Further, when the display surface is covered with the protection film as shown in FIG. 6, the external light (sunlight when the display device is installed outdoors, or light of illumination when the display device is installed indoors) is reflected by the protection film, whereby the surrounding scenery is reflected on the display surface and light from the light-emitting portions is partly absorbed by the protection film lowering the brightness. In this case, too, therefore, the visual recognition to the LED display device is worsened.

Thus, the countermeasures employed in the examples of FIGS. 5 and 6 are accompanied by such an inconvenience as worsening the visual recognition to LED display device.

Besides, the protection film employed in the example of FIG. 6 is generally expensive driving up the cost of producing the LED display device of a large screen.

Moreover, even when a predetermined distance is maintained between the human hand and the light-emitting portions by attaching the protrusions such as louvers or by covering the display surface with the protection film as done in FIGS. 5 and 6, the current due to electrostatic discharge often flows into the light-emitting portions and driving ICs over the distance when the potential difference is great between the human body and the LED display device.

Thus, the conventional countermeasures are not capable of reliably preventing damage due to static electricity.

In the case of sealing the lead portions of the LED lamps by potting as shown in FIG. 7, large machining cost and material cost are required for potting, driving up the cost of production.

Further, when the lead portions are sealed with the silicone resin, it becomes difficult to remove the light-emitting portions from the LED base plate. Therefore, in case that some light-emitting portions are found defective in the maintenance after the production, the whole base plate including the light-emitting portions (the whole cell case 33 containing the LED base plate 32 in the example of FIG. 7) must be replaced, resulting in an increase of the cost.

SUMMARY OF THE INVENTION

It is an object of the present invention to provide an LED display device which is capable of preventing damage caused by static electricity and of reliably preventing damage caused by static electricity without worsening the visual recognition.

The LED display device of the present invention comprises:

at least one panel having LEDs arranged in the form of a matrix on a display surface; and an electrically conductive member surrounding the light-emitting portions of said LEDs of said panel.

In this LED display device, therefore, when the hand of a man who arranges it approaches the display surface, the electric current caused by the electrostatic discharge flows into the electrically conductive member surrounding the light-emitting portions. Therefore, the current caused by the electrostatic discharge flows little into the light-emitting portions and into the driving ICs, and it achieves lower probability of malfunctioning or breakage in the light-emitting portions and in the driving ICs.

More preferably, a height of the electrically conductive member is nearly equal to, or not higher than, the height of the light-emitting portions of the LEDs in a direction perpendicular to said display surface.

The electrically conductive member is not greatly protruding forward beyond the position nearly equal to, or smaller than, the height of the light-emitting portions in a direction perpendicular to the display surface, i.e., is not greatly protruding forward beyond the light-emitting portions. The light-emitting portions are arranged at positions where they can be seen without being interrupted by the electrically conductive member even when they are watched from an upper inclined direction or from a lower inclined direction of the display surface. Therefore, the viewing angle is not narrowed unlike when protrusions such as louvers are attached.

Further, since the display surface is not covered with the protection film, the external light is not reflected, the surrounding scenery is not reflected on the display surface, light from the light-emitting portions are not absorbed and, hence, the brightness does not decrease. Thus, damage caused by static electricity is prevented without worsening the visual recognition.

Arranging the electrically conductive member requires less cost than covering the display surface with the protection film, and makes it possible to lower the cost.

In the LED display apparatus having the electrically conductive member arranged therein, it is more desired to ground the electrically conductive member.

Thus, all the currents due to the electrostatic discharge flow into ground from the electrically conductive member. Even when the potential difference is great between the human body and the LED display apparatus, therefore, the current due to the electrostatic discharge does not flow into the light-emitting portions or to the driving ICs, making it possible to reliably prevent damage caused by static electricity.

It is further desired that the electrically conductive member is formed by mounting, on the display surface, an electrically conductive plate having holes perforated at positions corresponding to the positions of the light-emitting portions on the display surface.

The electrically conductive plate can be easily arranged by being mounted on the display surface of the panel.

It is further desired to wire the LEDs on the base plate and to arrange an electrically nonconductive plate between the base plate and the electrically conductive member. This makes it possible to reliably insulate the LEDs, the base plate and the electrically conductive member.

It is further desired to make the display surface of the panel in black color. This easily absorbs light scattered around the light-emitting portions irrespective of the presence of the electrically conductive member, and heightens the contrast of image.

Next, when the LEDs are mounted on the base plate with their lead portions being exposed like in the example of FIG. 7, it is desired to arrange an electrically conductive member to surround the light-emitting portions on the display surface of the LED display apparatus at a position higher than the height of the lead portions in a direction perpendicular to the display surface.

In this LED display apparatus, the electrically conductive member is arranged at a position (protruded forward beyond the lead portions) higher than the height of the lead portions in a direction perpendicular to the display surface. When the human hand approaches the display surface, therefore, the current due to the electrostatic discharge flows into the electrically conductive member. Accordingly, the current due to the electrostatic discharge flows little into the lead portions, lowering the probability of malfunctioning or breakage in the light-emitting portions and in the driving ICs.

The electrically conductive member in the direction perpendicular to the display surface has a height larger than that of the lead portions but is nearly equal to, or smaller than, the height at the ends of the light-emitting portions (i.e., without protruding forward beyond the light-emitting portions). Therefore, the light-emitting portions can be seen without being interrupted by the electrically conductive member even when they are watched from an upper inclined direction or from a lower inclined direction of the display surface. Thus, damage caused by static electricity is prevented without worsening the visual recognition.

Arranging the electrically conductive member requires less cost than sealing the lead portions by potting as is done in the prior art, and makes it possible to lower the cost.

In the LED display apparatus having the electrically conductive member arranged therein, it is more desired to ground the electrically conductive member.

Thus, all the currents due to the electrostatic discharge flow into ground from the electrically conductive member. Even when the potential difference is great between the human body and the LED display apparatus, therefore, the current due to the electrostatic discharge does not flow into the lead portions, making it possible to reliably prevent damage caused by static electricity.

It is further desired that the electrically conductive member is formed by using an electrically conductive plate having holes perforated at positions corresponding to the positions of the light-emitting portions on the display surface.

By using the above electrically conductive plate, it is allowed to easily arrange an electrically conductive member not protruded forward beyond the lead portions but not protruded forward beyond the ends of the light-emitting portions.

Even in case that some light-emitting portions become defective after the production, the electrically conductive plate is taken out to easily remove only those defective light-emitting portions from the LED base plate to repair or replace them. Therefore, even the maintenance requires a decreased cost compared with when the lead portions are sealed by potting as done in the related art.

BRIEF DESCRIPTION OF THE DRAWINGS

These and other objects and features of the present invention will become clear from the following description of the preferred embodiments given with reference to the accompanying drawings, in which.

DESCRIPTION OF THE PREFERRED EMBODIMENTS

Figure 1:
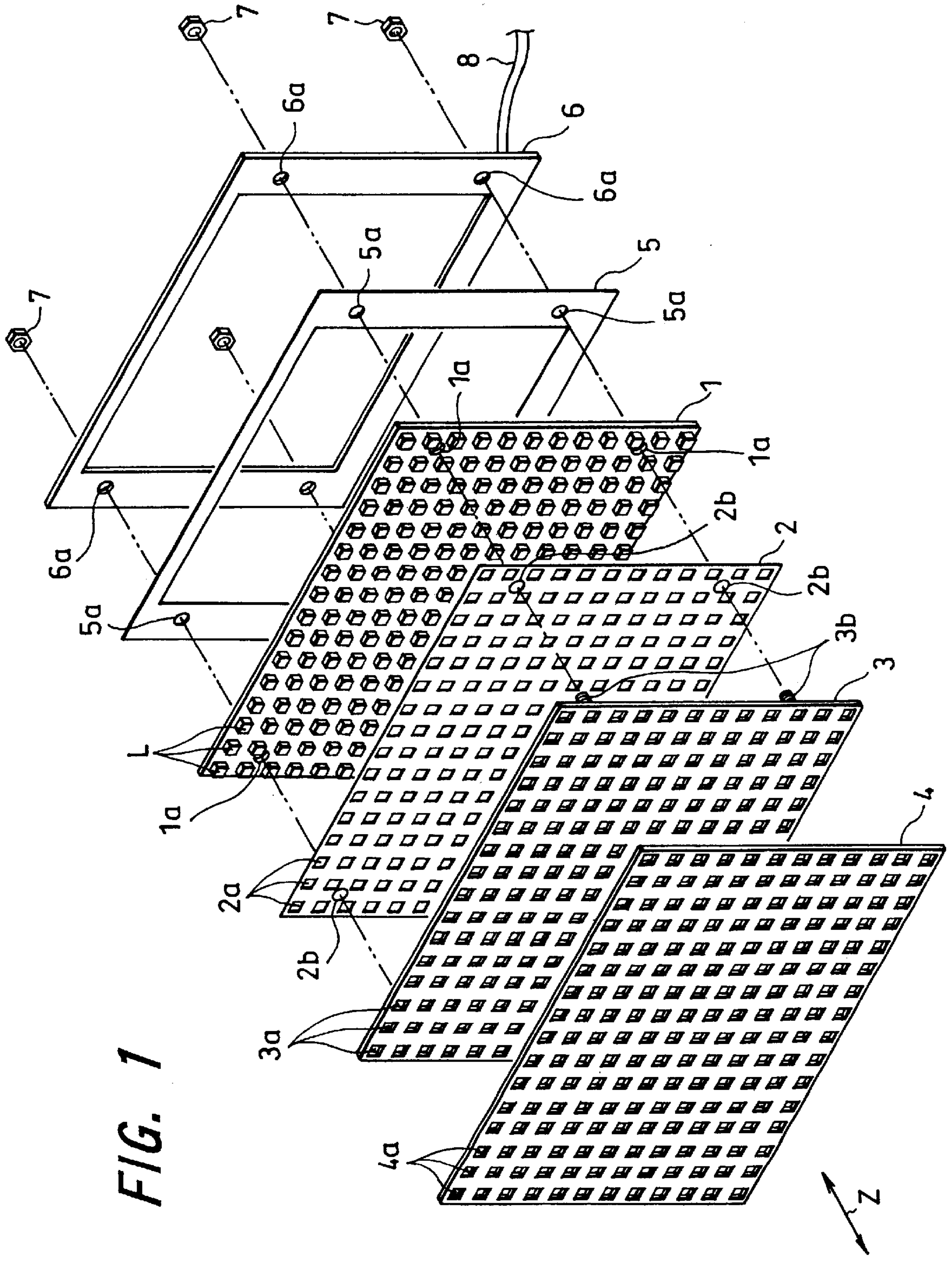
FIG. 1 is a perspective view illustrating a panel structure in an LED display apparatus to which the present invention is adapted.

FIG. 1 is a perspective view illustrating a panel structure in an LED display apparatus for displaying an image to which the present invention is adapted. In this panel, the light-emitting portions L which are LEDs are arranged on a base plate 1 in the form of a matrix to constitute display elements.

In this embodiment, the LED is a chip of the SMD (surface mount apparatus) type mounted on the surface of the base plate, which is an element constituting a light-emitting portion that emits lights of three primary colors of red, green and blue. Driving ICs (not shown) are provided on the surface of the base plate (hereinafter referred to as LED base plate) 1 of the side opposite to the display surface (surface on where light-emitting portions L are arranged), and on the LED base plate 1 is formed, by patterning, the wiring (not shown) for connecting the light-emitting portions L to the driving ICs. The LED display apparatus of a screen of any size is constituted by arranging a plurality of panels (display modules) like tiles.

In the panel, an electrically conductive plate 3 is mounted on the display surface of the LED base plate 1 via an insulating plate 2. The insulating plate 2 prevents the electrically conductive plate 3 from coming in contact with the connection terminals of the light-emitting portions L on the LED base plate 1. Further, an electrically nonconductive black face plate 4 is stuck with an adhesive onto the surface of the electrically conductive plate 3 on the side opposite to the surface facing the insulating plate 2. The electrically conductive plate 3 is, for example, an aluminum plate and the face plate 4 is, for example, a plastic plate.

The insulating plate 2, electrically conductive plate 3 and face plate 4 have holes 2*a*, 3*a* and 4*a* respectively perforated at positions corresponding to the positions of the light-emitting portions L on the display surface of the LED base plate 1. The total thickness of these plates 2, 3 and 4 is nearly equal to the height of the light-emitting portions L in a direction (Z-direction in the drawing) perpendicular to the display surface of the LED base plate 1.

Electrically conductive and externally threaded bolts 3*b* are attached to the electrically conductive plate 3 at four corners on the surface facing the LED base plate 1. The insulating plate 2 and the LED base plate 1 have holes 2*b*, 1*a* respectively at positions corresponding to the bolts 3*b*.

The bolts 3*b* are coated with an insulating material at predetermined portions, or are thinner than the holes 1*a* of the LED base plate 1 so as to not come in contact with the LED base plate 1, or are attached at positions where they do not come in contact with the light-emitting portions L, driving ICs or wiring on the LED base plate 1, to maintain insulation from the light-emitting portions L, driving ICs and wiring.

Further, a frame-like electrically conductive plate 6 is attached, via a frame-like insulating plate 5, to the surface of the LED base plate 1 on the side opposite to the display surface. Holes 5*a*, 6*a* are perforated in the insulating plate 5 and in the electrically conductive plate 6 respectively at positions corresponding to the bolts 3*b* of the electrically conductive plate 3. An end of a conductor line 8 is connected to the electrically conductive plate 6 and the other end of the conductor line 8 is connected to an earth terminal (not shown), enabling the electrically conductive plate 6 to be grounded.

The bolts protrude to the back side of the panel passing through the holes 2*b*, 1*a*, 5*a*, 6*a*, and to which are fitted the nuts (internally threaded) 7, so that the electrically conductive plate 3, insulating plate 2, LED base plate 1, insulating plate 5 and electrically conductive plate 6 are secured together.

Figure 2:
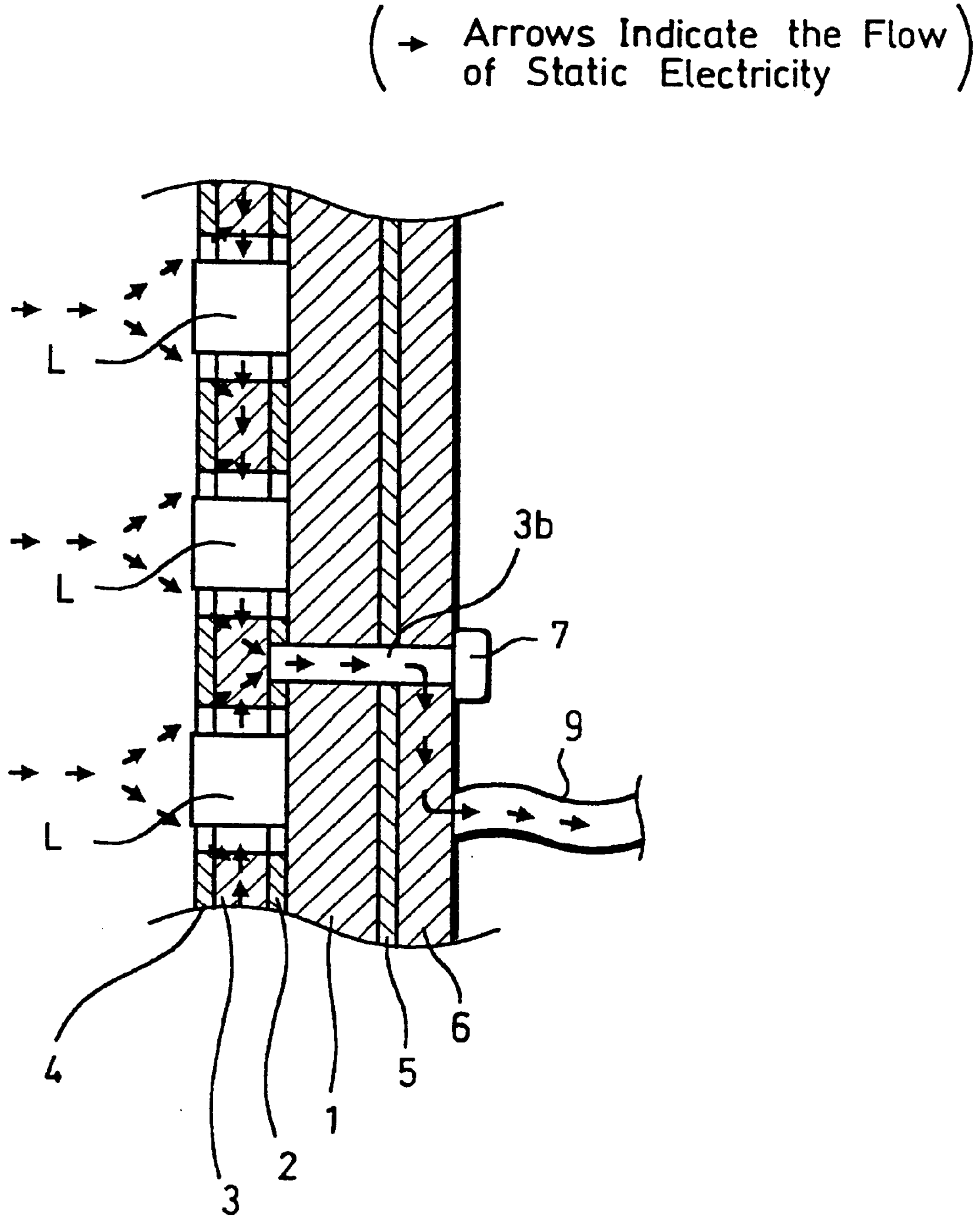
FIG. 2 is a sectional view illustrating the prevention of damage caused by static electricity in the LED display apparatus formed by arranging the panel of FIG. 1.

Next, described below is how to prevent damage caused by static electricity in the LED display apparatus constituted by arranging the panels shown in FIG. 1. FIG. 2 is a sectional view illustrating a portion of the panel of FIG. 1 attached by the bolt 3*b* to show the flow of an electric current due to electrostatic discharge.

When the electrostatic discharge occurs due to a human hand that has approached the display surface of the panel, the electric current due to discharge flows into the electrically conductive plate 3 as shown in FIG. 2. The current flows through the electrically conductive plate 3, and all flows into ground through the bolt 3*b*, electrically conductive plate 6 and conductor 8.

The insulating plate 2 is present between the electrically conductive plate 3 and the LED base plate 1, and another insulating plate 5 is present between the electrically conductive plate 6 and the LED base plate 1. Therefore, the current flowing from the electrically conductive plate 3 to ground, is not short-circuited to, i.e., does not flow, to the light-emitting portions L or to the driving ICs on the LED base plate 1. Thus, the current due to electrostatic discharge does not flow to the light-emitting portions L or to the driving ICs, reliably preventing damage caused by static electricity.

The total thickness of the insulating plate 2, electrically conductive plate 3 and face plate 4 is nearly equal to the height of the light-emitting portions L in a direction perpendicular to the display surface of the LED base plate 1.

Therefore, these plates 2, 3 and 4 do not protrude forward beyond the light-emitting portions. L. Accordingly, the light-emitting portions L can be seen without being interrupted by these plates 2, 3 and 4 even when they are viewed from an upper inclined direction or a lower inclined direction of the display surface. Therefore, the viewing angle is not narrowed unlike when protrusions like louvers are attached.

Besides, since the display surface is not covered with a protection film, the external light is not reflected, the surrounding scenery is not reflected on the display surface, light from the light-emitting portions is not absorbed, and brightness does not decrease. Thus, damage due to static electricity is reliably prevented without worsening the visual recognition.

The electrically conductive plate 3 is cheaper than the protection film and enables the LED display apparatus to be realized at a decreased cost.

By attaching the electrically conductive plate 3 on the display surface, the electrically conductive member is easily arranged at a position without protruding forward beyond the light-emitting portions L.

By attaching a black face plate 4, further, the peripheries of the light-emitting portions L become easily black to enhance the contrast of image irrespective of the presence of the electrically conductive plate 3.

In the examples of FIGS. 1 and 2, the total thickness of the insulating plate 2, electrically conductive plate 3 and face plate 4 is nearly equal to the height of the light-emitting portions L (slightly smaller than the height of the light-emitting portions L). The total thickness of these plates may be further decreased, as a matter of course. Or, the total thickness of these plates may be slightly larger than the height of the light-emitting portions L as long as the viewing angle does not become narrow.

In this embodiment, further, the black face plate 4 is stuck to the electrically conductive plate 3. As another embodiment, however, the surface of the electrically conductive plate 3 may be painted black on the side opposite to the surface facing the insulating plate 2 instead of using the face plate 4. In this case, the total thickness of the insulating plate 2 and the conductive plate 3 may be set to be nearly equal to, or smaller than, the height of the light-emitting portions L.

Or, an electrically conductive film (e.g., aluminum film) may be formed by vacuum evaporation on the surface of the face plate 4 that is facing the electrically conductive plate 3, and the electrode (corresponding to the bolt 3*b* of the electrically conductive plate 3) connected to this electrically conductive film may be mounted on the face plate 4, to omit the electrically conductive plate 3. In this case, the total thickness of the insulating plate 2 and the facing plate 4 may be set to be nearly equal to, or smaller than, the height of the light-emitting portions L.

In this embodiment, the electrically conductive plate 3 is mounted on the LED base plate 1 via the insulating plate 2. As another embodiment, however, an electrically conductive film insulated from the light-emitting portions L, driving ICs and wiring, may be formed by patterning on the LED base plate 1, and the electrode connected to the electrically conductive film may be mounted on the LED base plate 1 to omit the insulating plate 2 and the electrically conductive plate 3.

In this embodiment, the electrically conductive plate 6 is grounded and thereby the electrically conductive plate 3 is indirectly grounded through the bolt 3*b* and the electrically conductive plate 6. As another embodiment, however, the electrically conductive plate 3 may be directly grounded so that the current due to the electrostatic discharge directly flows from the electrically conductive plate 3 to ground, omitting the bolt 3*b* and the electrically conductive plate 6.

In this embodiment, the electrically conductive plate 6 is grounded. As another embodiment, however, the electrically conductive plate 6 may not be grounded. In this case, too, the current due to the electrostatic discharge flows into the electrically conductive plate 3 surrounding the light-emitting portions L but does not flow into the light-emitting portions L or into the driving ICs, preventing damage caused by static electricity. In the LED display apparatus of a large screen, in particular, a current of a magnitude close to that of the case that the electrically conductive plate 3 is grounded flows into the electrically conductive plate 3 since the electrically conductive plate 3 has a wide area, making it possible to decrease damage caused by static electricity to a sufficient degree.

According to the LED display apparatus as described above, the current due to the electrostatic discharge flows into the electrically conductive member arranged at positions around the light-emitting portions. The current, however, does not flow into the light-emitting portions or into the driving ICs.

Arranging the electrically conductive member so as not to protrude forward beyond the light-emitting portions, damage caused by the static electricity is prevented without worsening the visual recognition, unlike the case when protrusions like louvers are attached to the display surface or the display surface is covered with the protection film.

Arranging the electrically conductive member requires a decreased cost as compared with when the display surface is covered with the protection film, making it possible to decrease the cost.

When the electrically conductive member is grounded, all the currents due to electrostatic discharge flow from the electrically conductive member into ground, and damage due to static electricity is reliably prevented.

The electrically conductive member can be easily arranged when the electrically conductive member is formed by mounting, on the display surface, an electrically conductive plate having a thickness nearly equal to, or smaller than, the height of the light-emitting portions and having holes perforated at positions corresponding to the positions of the light-emitting portions on the display surface.

The electrically conductive plate and the base plate on which LEDS are arranged can be reliably insulated from each other by attaching an electrically nonconductive plate to the surface of the electrically conductive plate on the side opposite to the surface that faces the display surface, the electrically nonconductive plate having holes perforated at positions corresponding to the positions of the light-emitting portions on the display surface. Further, the total thickness of the electrically conductive plate and the electrically nonconductive plate is set to be nearly equal to, or smaller than, the height of the light-emitting portion, and the display surface is painted black. Then, the scattered light around the light-emitting portions is easily absorbed irrespective of the presence of the electrically conductive plate, and the contrast of the image is enhanced.

Figure 3B:
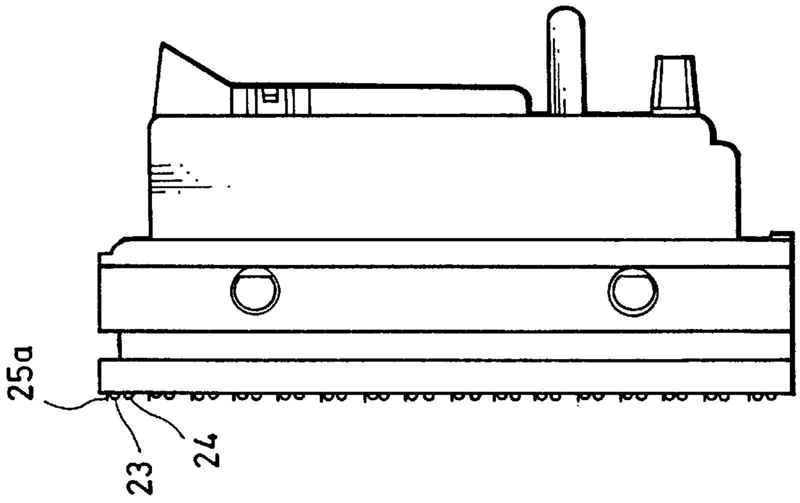
FIG. 3 is a view illustrating the appearance of the panel of another example of the LED display apparatus to which the present invention is adapted.
Figure 3A:
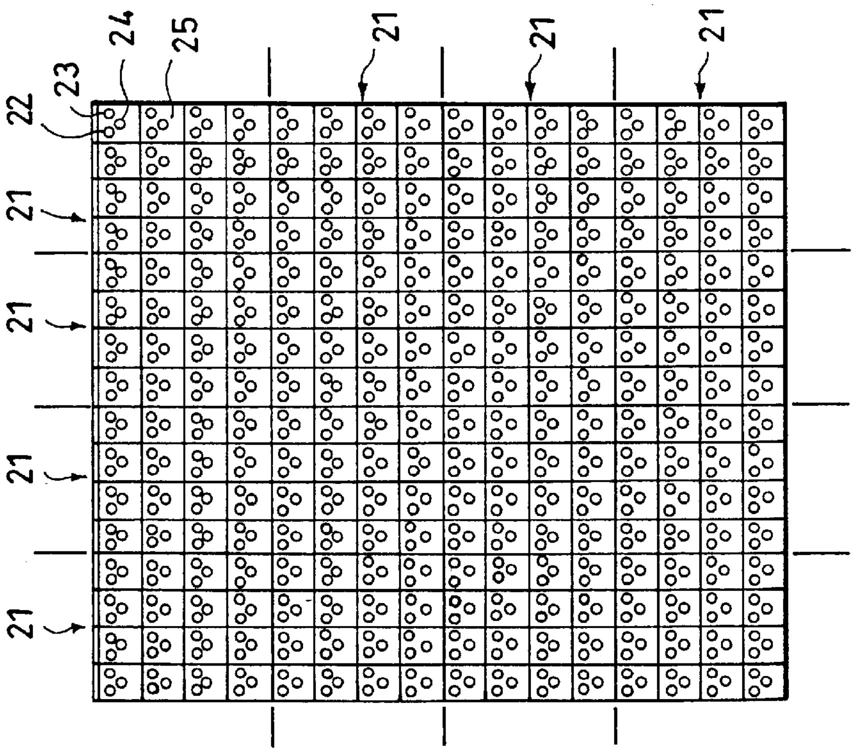
Figure 4:
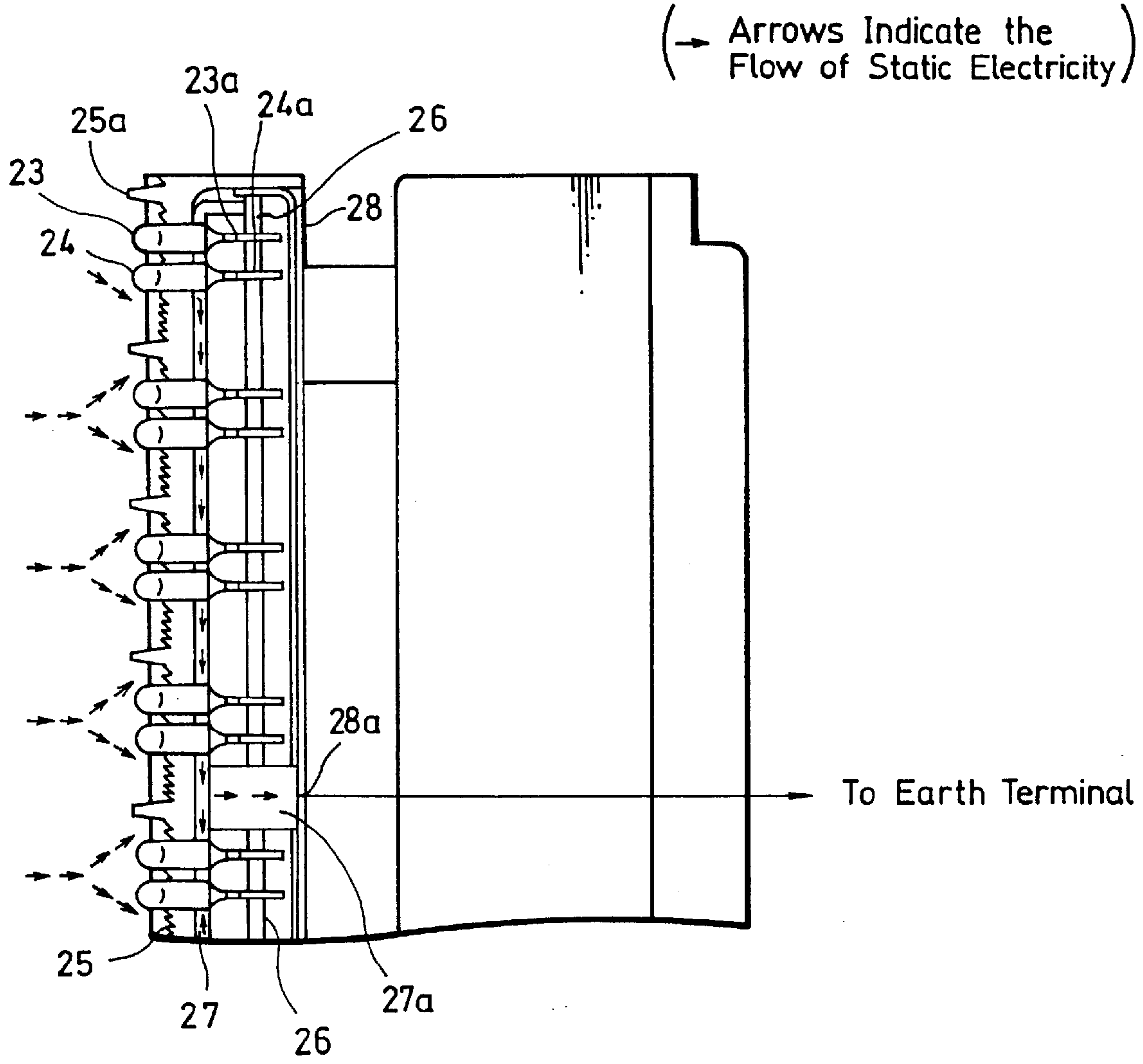
FIG. 4 is a side sectional view illustrating a panel structure in the LED display apparatus of FIG. 3.
Figure 7:
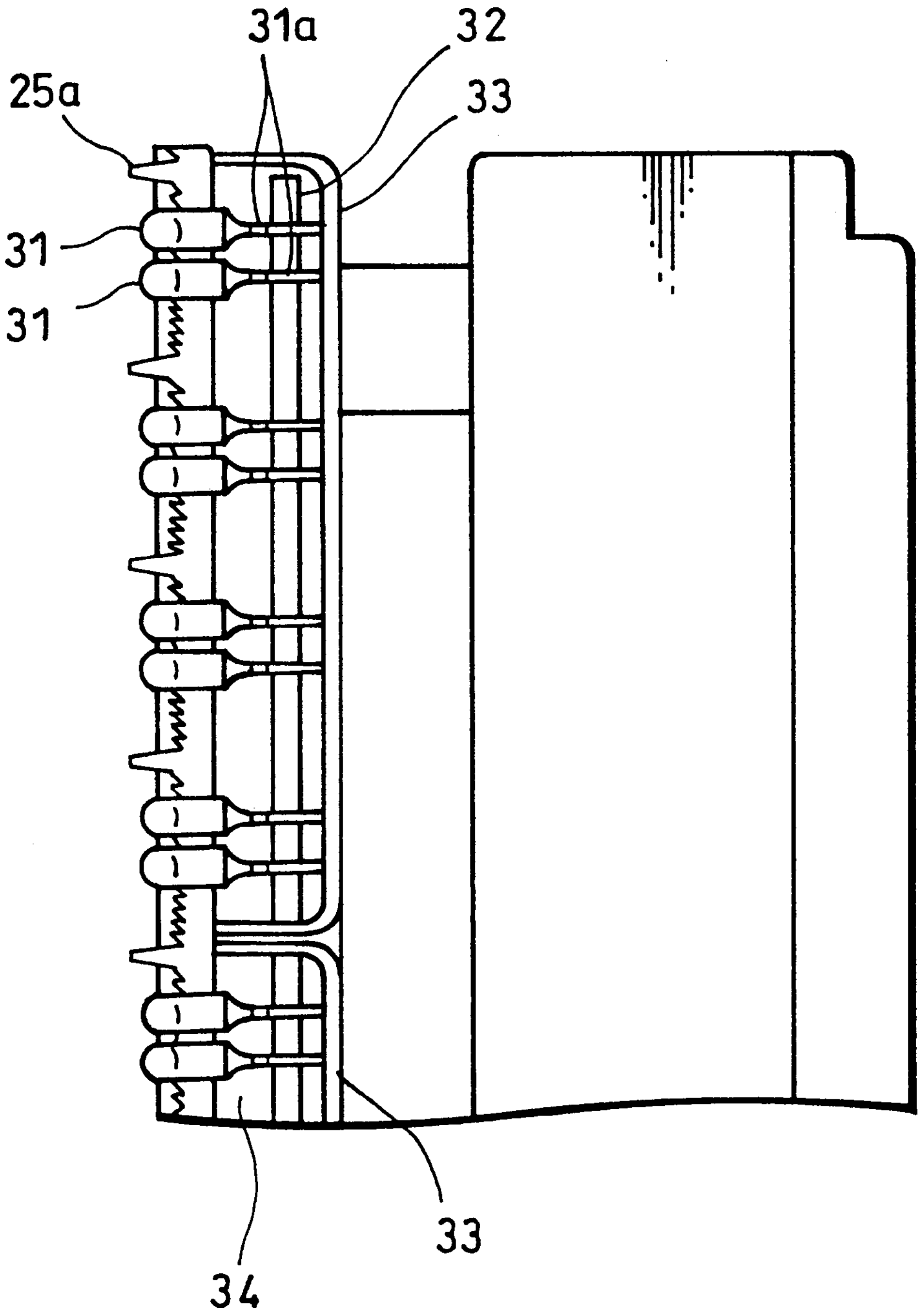
FIG. 7 is a view illustrating another countermeasure for preventing damage caused by static electricity in a conventional LED display apparatus.

FIGS. 3 and 4 illustrate an embodiment where the light-emitting portions have a structure with their lead portions being exposed as shown in FIG. 7 and to which the present invention is adapted. FIG. 3 illustrates the appearance of the LED display apparatus having light-emitting portions of such a structure, wherein FIG. 3A is a front view and FIG.

3B is side view. In this LED display apparatus are arranged a plurality of panels (display modules) 21 like tiles. On each panel 21 are arranged, in the form of a matrix, 16 sets (=vertical 4 sets×lateral 4 sets) of light-emitting portions as pixels each having a set of LED lamps 22, 23 and 24 having bullet-like external shapes and having a lens function for distributing red light, green light and blue light in predetermined directions. A piece of common light-shielding louver 25 is mounted on the panel 21, the light-shielding louver 25 having holes perforated at positions corresponding to the positions of the LED lamps 22, 23, 24 on the display surface.

FIG. 4 is a side sectional view illustrating the structure of each panel 21 of FIG. 3, and wherein four sets of LED lamps 22, 23, 24 (LED lamp 22 is concealed by the LED lamp 23) on the upper side constitute a light-emitting portion in the panel 21. The LED lamps 22, 23 and 24 on each panel 21 are mounted on the LED base plate 26 with their lead portions 22*a*, 23*a*, 24*a* (lead portion 22*a* is concealed by the lead portion 23*a*) being exposed.

Driving ICs (not shown) are provided on the surface of the LED base plate 26 on the side opposite to the display surface (where the LED lamps 22, 23, 24 are arranged). On the LED base plate 26 is formed, by patterning, a wiring (not. shown) for connecting the LED lamps 22, 23 and 24 to the driving ICs.

The louver 25 is mounted to be separated away from the display surface of the LED base plate 26. An electrically conductive plate 27 is stuck with an adhesive to the surface of the louver 25 facing the LED base plate 26, the electrically conductive plate 27 having a hole perforated at the same position as the louver 25.

The height of the electrically conductive plate 27 in a direction perpendicular to the display surface of the LED base plate 26 is larger than the height of the lead portions 22*a*, 23*a*, 24*a*, but is lower than the height of the ends of the LED lamps 22, 23 and 24.

The electrically conductive plate 27 has an electrode 27*a* at a position facing a gap between the LED base plates 26 of the neighboring panels 21. The electrode 27*a* is covered with an insulating material, or is thinner than the gap of the LED base plates 26 so as to not come in contact with the LED base plates 26. Otherwise it is attached at a position where it comes in contact with none of the LED lamps 22 23, 24, driving ICs or wiring on the LED base plates 26, and is thus insulated from the LED lamps 22, 23, 24, driving ICs and wiring.

A piece of common back plate 28 is mounted on the surfaces of the LED base plates 26 on the side opposite to the display surfaces so as to protect the LED base plates 26 of all panels 21 of FIG. 3, being separated away from the LED base plates 26. The back plate 28 has a hole 28*a* at a position opposed to the electrode 27*a*.

An end of the conductor line (not shown) is connected to the electrode 27*a* through the hole 28*a* in the back plate 28, and the other end of the conductor line is connected to the earth terminal (not shown), so that the electrically conductive plate 27 is grounded.

Next, described below is how the LED display apparatus of FIGS. 3 and 4 is prevented from being damaged by the static electricity. When an electrostatic discharge occurs due to human hand that has approached the display surface of the panel 21, the current due to the discharge flows into the electrically conductive plate 27 positioned protruding forward beyond the lead portions 22*a*, 23*a*, 24*a* as shown in FIG. 4. The current flows through the electrically conductive plate 27 and, then, all flows into ground through the electrode 27*a*, conductor line mentioned above and earth terminal.

Therefore, the current due to the electrostatic discharge does not flow into the lead portions 22*a*, 23*a*, 24*a*, reliably preventing damage caused by the static electricity.

The electrically conductive plate 27 is cheap and enables the LED display apparatus to be realized at a decreased cost compared to that of the case that the lead portions are sealed by potting as done by the prior art.

Even in case any one of the LED lamps 22, 23 or 24 becomes defective after the production, the louver 25 can be removed, the defective LED lamp only can be easily taken out from the LED apparatus 26 and can be repaired or replaced. Therefore, the maintenance cost can be decreased compared with that of the case that the lead portions are sealed by potting as is done by the prior art.

By sticking the electrically conductive plate 27 to the louver 25, further, the electrically conductive member can be easily arranged at positions protruding forward beyond the lead portions 22*a*, 23*a*, 24*a* but not protruding forward beyond the ends of the LED lamps 22, 23, 24.

Figure 5A:
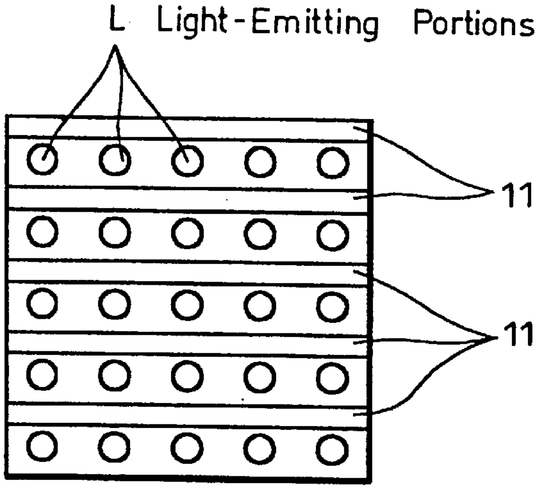
FIG. 5 is a view illustrating a countermeasure for preventing damage caused by static electricity in a conventional LED display apparatus.
Figure 5B:
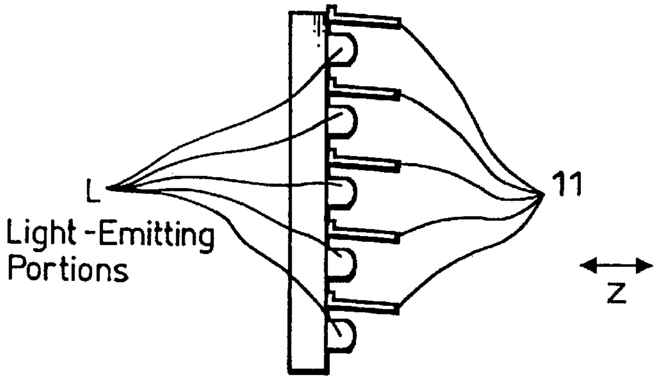
Figure 6:
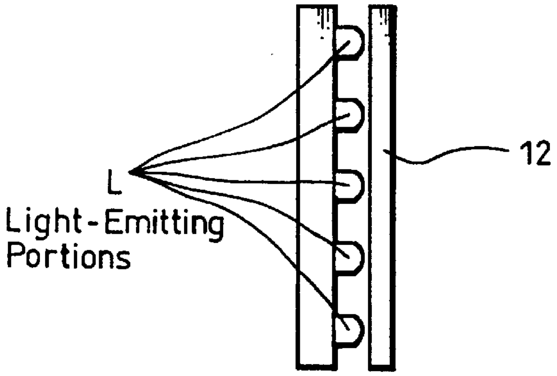
FIG. 6 is a view illustrating another countermeasure for preventing damage caused by static electricity in a conventional LED display apparatus.

Besides, the end 25*a* of the louver 25 is protruding forward slightly beyond the ends of the LED lamps 22, 23, 24 for shielding light (but is not greatly protruding forward unlike the louver 11 for coping with the static electricity shown in FIG. 5), and the viewing angle does not become narrow.

In the embodiment of FIGS. 3 and 4, the electrically conductive plate 27 is stuck to the louver 25. As another embodiment, however, the electrically conductive plate may not be stuck to the louver but may be attached at a position higher than the height of the lead portions 22*a*, 23*a*, 24*a* in a direction perpendicular to the display surface. Or, an electrically conductive film may be formed by patterning on the surface of the louver 25 facing the LED base plate 26.

In this embodiment, further, the electrically conductive plate 27 is grounded. As another embodiment, however, the electrically conductive plate 27 may not be grounded. In this case, too, the current due to the electrostatic discharge flows into the electrically conductive plate 27 protruding forward beyond the lead portions 22*a*, 23*a*, 24*a*, but flows little into the lead portions 22*a*, 23*a*, 24*a*, preventing damage caused by static electricity. In the LED display apparatus of a large screen, in particular, the area of the electrically conductive plate 27 increases and, hence, a current of a magnitude close to that of the case that the electrically conductive plate 27 is grounded flows into the electrically conductive plate 27, preventing damage due to static electricity to a sufficient degree.

In the LED display apparatus in which the light-emitting portions are mounted on the base plate in a state where the lead portions are exposed, the electric current due to the electrostatic discharge flows into the electrically conductive member arranged at positions around the light-emitting portions and protruding forward beyond the lead portions. Therefore, only a small amount of the current due to the electrostatic discharge flows little into the lead portions.

The height of the electrically conductive member in a direction perpendicular to the display surface is higher than the lead portions but is nearly equal to, or is not higher than, the height of the ends of the light-emitting portions. Therefore, the light-emitting portions can be seen without interrupted by the electrically conductive member even when they are watched from an upper inclined direction or a from a lower inclined direction of the display surface. This prevents damage caused by static electricity without worsening the visual recognition.

Arranging the electrically conductive member requires a decreased cost as compared to the case that the lead portions are sealed by potting, making it possible to lower the cost.

In this LED display apparatus, too, when the electrically conductive member is grounded, all the currents due to the electrostatic discharge flow from the electrically conductive member into ground, reliably preventing damage caused by static electricity.

In this LED display apparatus, too, when the electrically conductive member is formed by using an electrically conductive plate having holes perforated at positions corresponding to the positions of the light-emitting portions on the display surface, the electrically conductive member can be easily arranged at a position protruding forward beyond the lead portion but not protruding forward beyond the ends of the light-emitting portions. Besides, the electrically conductive plate can be removed and it is easy to take out the light-emitting portions from the LED base plate to repair or replace them, lowering even the maintenance cost.

In the embodiments shown in FIGS. 1, 2, 3 and 4, the invention is adapted to the LED display apparatus for displaying image in which a plurality of display modules each including the light-emitting portions arranged in the form of a matrix are arranged like tiles. Not being limited thereto only, however, the present invention may be adapted to an LED display apparatus for displaying image using only a piece of the display element in which the light-emitting elements are arranged in the form of a matrix, or to an LED display apparatus for displaying characters using only a piece of the display element in which the light-emitting portions are arranged in the form of segments or a matrix.

Further, the light-emitting portion in the LED display apparatus to which the invention is applied may be an LED lamp including a plurality of LED chips emitting lights of different colors (e.g., three LED chips of red color, blue color and green color) or an LED lamp including one or a plurality of LED chips of a single color.

In the embodiment of FIGS. 1 and 2, the light-emitting portions are rectangular LED lamps and in the embodiment of FIGS. 3 and 4, the light-emitting portions are LED lamps of the shape of a bullet. However, the light-emitting portions in the LED display apparatus to which the invention is adapted may have any suitable shape (e.g., cylindrical shape) in addition to the rectangular shape or the bullet shape.

The invention may be adapted not only to the LED display apparatus in which a single light-emitting portion is constituted by a single LED lamp but also to the LED display apparatus in which the arrangement of a plurality LED chips is covered with a common resin mold or a diffusion plate to form the arrangement of light-emitting portions.

While the invention has been described with reference to specific embodiments chosen for purpose of illustration, it should be apparent that numerous modifications could be made thereto by those skilled in the art without departing from the basic concept and scope of the invention.

What is claimed is:

1. A light emitting diode display apparatus comprising:

a panel having a plurality of light emitting diodes arranged in a matrix form on a display surface thereof, with the plurality of light emitting diodes wired to a base plate;

an electrically nonconductive plate; and an electrically conductive member for surrounding light emitting portions of said plurality of light emitting diodes of said panel, with said electrically nonconductive plate positioned between the base plate and the electrically conductive member and a thickness of the electrically conductive member being substantially equal to a height of the plurality of light emitting diodes, wherein said electrically conductive member is electrically connected to ground and electrically insulated from said plurality of light emitting diodes, whereby a current caused by electrostatic discharge flows to ground through said electrically conductive member insulated from said plurality of light emitting diodes.

2. The light emitting diode display apparatus according to claim 1, wherein a height of said electrically conductive member is not higher than a height of said light-emitting portions of said plurality of light emitting diodes in a direction perpendicular to said display surface.

3. The light emitting diode display apparatus according to claim 1, wherein said electrically conductive member is electrically connected to ground.

4. The light display emitting diode display apparatus according to claim 1, wherein said electrically conductive member is an electrically conductive plate having holes perforated at positions corresponding to said light-emitting portions on said display surface.

5. The light emitting diode display apparatus according to claim 1, further comprising:

a base plate on which said plurality of light emitting diodes are wired; and an electrically nonconductive plate disposed between said base plate and said electrically conductive member.

6. The light emitting diode display apparatus according to claim 1, wherein said display surface of said panel is black.

7. The light emitting diode display apparatus according to claim 1, wherein said plurality of light emitting diodes include elements that emit lights of three primary colors formed of red color, green color and blue color from respective light-emitting portions thereof.

8. The light emitting diode display apparatus according to claim 7, wherein said electrically conductive member is electrically connected to ground.

9. The light emitting diode display apparatus according to claim 7, wherein said electrically conductive member is an electrically conductive plate having holes perforated at positions corresponding to said light-emitting portions on said display surface.

10. The light emitting diode display apparatus according to claim 7, wherein pixels are constituted by groups of said plurality of light emitting diodes that emit lights of red color, green color and blue color, and said pixels are arranged in the form of a matrix.

11. The light emitting diode display apparatus according to claim 7, wherein said plurality of light emitting diodes are each elements having a bullet-like outer shape.

12. The light emitting diode display apparatus according to claim 1, further comprising a base plate on which said plurality of light emitting diodes are wired, said plurality of light emitting diodes being arranged on said base plate so that electrical lead portions thereof are exposed, and said electrically conductive member being arranged at a position higher than said lead portions on a front side of said display surface and in a direction perpendicular to said display surface.

* * * * *